United States Patent
Yun et al.

(10) Patent No.: US 10,613,363 B2
(45) Date of Patent: *Apr. 7, 2020

(54) DISPLAY DEVICE AND MULTI DISPLAY DEVICE USING THE SAME

(71) Applicant: SAMSUNG DISPLAY CO., LTD., Yongin-si, Gyeonggi-do (KR)

(72) Inventors: Su Young Yun, Asan-si (KR); Sung Hun Lee, Cheonan-si (KR); Joo Hyuk Park, Asan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/262,271

(22) Filed: Jan. 30, 2019

(65) Prior Publication Data

US 2019/0163008 A1 May 30, 2019

Related U.S. Application Data

(62) Division of application No. 15/214,051, filed on Jul. 19, 2016, now Pat. No. 10,228,579, which is a (Continued)

(30) Foreign Application Priority Data

Jul. 17, 2014 (KR) .......................... 10-2014-0090274

(51) Int. Cl.
*G02F 1/1333* (2006.01)
*H05K 1/14* (2006.01)
(Continued)

(52) U.S. Cl.
CPC ...... *G02F 1/133308* (2013.01); *G02F 1/1368* (2013.01); *G02F 1/13452* (2013.01);
(Continued)

(58) Field of Classification Search
CPC .... G06F 1/1647; G06F 3/1446; G09F 9/3026; H05K 5/0021; H05K 5/0017;
(Continued)

(56) References Cited

U.S. PATENT DOCUMENTS 6,618,111 B1   9/2003   Nagata et al.
7,864,516 B2 * 1/2011   Lee ..................... H05K 5/0017
                                                        345/1.3
(Continued)

FOREIGN PATENT DOCUMENTS

KR   10-2008-0003034   1/2008
KR   10-2010-0086351   7/2010
KR   10-2014-0006512   1/2014

OTHER PUBLICATIONS

U.S. Appl. No. 14/591,343.
U.S. Appl. No. 15/214,051.

*Primary Examiner* — James Wu
(74) *Attorney, Agent, or Firm* — F. Chau & Associates, LLC (57) ABSTRACT

A display device includes: a display panel; a bottom chassis in which the display panel is accommodated; a driving circuit substrate disposed on an outside surface of the bottom chassis; at least one flexible printed circuit board connecting the display panel to the driving circuit substrate; and a top chassis configured to cover an edge portion of a top surface and side surfaces of the display panel, wherein the top chassis has an opening formed in an area in contact with the flexible printed circuit board.

11 Claims, 9 Drawing Sheets

Related U.S. Application Data division of application No. 14/591,343, filed on Jan. 7, 2015, now abandoned.

(51) Int. Cl.
*H05K 7/02* (2006.01)
*G02F 1/1345* (2006.01)
*G02F 1/1343* (2006.01)
*G02F 1/1368* (2006.01)
*H05K 5/00* (2006.01)
*H05K 5/02* (2006.01)
*G02F 1/1335* (2006.01)

(52) U.S. Cl.
CPC ....... *G02F 1/134336* (2013.01); *H05K 1/147* (2013.01); *H05K 5/0021* (2013.01); *H05K 5/0217* (2013.01); *H05K 7/02* (2013.01); *G02F 1/13439* (2013.01); *G02F 1/133514* (2013.01); *G02F 2001/13332* (2013.01); *G02F 2001/133314* (2013.01); *G02F 2201/121* (2013.01); *G02F 2201/123* (2013.01); *H05K 2201/10128* (2013.01); *H05K 2201/10136* (2013.01)

(58) Field of Classification Search
CPC ...... H05K 5/02107; H05K 7/02; H05K 1/147; H05K 2201/10128; Y10S 345/905; G09G 2300/026; G02F 1/133308; G02F 1/13452; G02F 2001/133314; G02F 2001/13332

See application file for complete search history.

(56) References Cited

U.S. PATENT DOCUMENTS

| | | |
|---|---|---|
| 2001/0002145 A1 | 5/2001 | Lee et al. |
| 2002/0051349 A1 | 5/2002 | Serizawa et al. |
| 2007/0091225 A1 | 4/2007 | Ma et al. |
| 2007/0236910 A1* | 10/2007 | Yun ............... G02F 1/133308 362/23.18 |
| 2008/0030649 A1* | 2/2008 | Choi ............... G02B 5/021 349/64 |
| 2010/0302717 A1* | 12/2010 | Oh ............... G02F 1/133308 361/679.01 |
| 2014/0009721 A1 | 1/2014 | Park |
| 2014/0035795 A1 | 2/2014 | Park et al. |
| 2016/0021773 A1 | 1/2016 | Yun et al. |
| 2016/0327827 A1 | 11/2016 | Yun et al. |

* cited by examiner

DISPLAY DEVICE AND MULTI DISPLAY DEVICE USING THE SAME

CROSS-REFERENCE TO RELATED APPLICATION

This application is a divisional of U.S. application. Ser. No. 15/214,051 filed on Jul. 19, 2016 which is a divisional of U.S. application Ser. No. 14/591,343, filed on Jan. 7, 2015, which claims priority under 35 U.S.C. § 119 to Korean Patent Application No. 10-2014-0090274, filed on Jul. 17, 2014 in the Korean Intellectual Property Office, the disclosures of which are incorporated by reference herein in their entirety.

TECHNICAL FIELD

Exemplary embodiments of the present invention relate to a display device, and more particularly to a display device having multi-displays.

DISCUSSION OF RELATED ART

Examples of display devices may include a liquid crystal display (LCD), an organic light emitting diode (MED) display, a plasma display panel (PDP), and an electrophoretic display (EPD).

Display devices may include a display panel on which a plurality of pixels for displaying images are disposed, a driving printed circuit board (PCB) disposed on one side surface of the display panel, and a chip on film (COP), or a tape carrier package (TCP) connecting the display panel and the driving PCB. The COF or the TCP may include circuit lines disposed on an element having a panel that is thin and capable of being bent, such that electric signals of the driving PCB can be applied to the display panel.

The PCB may be in contact with a side surface of a mold frame or a rear surface of a bottom chassis. The COE or the TCP may be bent toward the side surface of the mold frame. In this configuration, a top chassis may protect the COF or the TCP disposed on the side surface of the mold frame.

A plurality of display devices may be combined in a tiling method to form a multi-display device having a relatively large screen. Multi-display devices may appear as one screen in total by minimizing non-display areas between the respective display devices.

The respective display devices may minimize an area where an edge portion of the display panel and a top chassis overlap, such that the display panel and the top chassis are disposed in contact to each other, and damage may occur in the COF or TCP disposed between the display panel and the top chassis. In the multi-display device where a plurality of coupled display devices are used, the display panel and the top chassis may be adjacently disposed due to the weight of display devices that are adjacently disposed, and damage may occur in the COF or TCP.

SUMMARY

Exemplary embodiments of the present invention provide a display device which may minimize an area where a display panel and a top chassis overlap, may reduce or prevent damage in a chip on film (COF), or a tape carrier package (TCP) and may reduce or prevent damage to a multi-display device using the display device.

According to an embodiment of the present invention, a display device includes a display panel and a bottom chassis in which the display panel is disposed. A driving circuit substrate is disposed on an outside surface of the bottom chassis. At least one flexible printed circuit board connects the display panel to the driving circuit substrate. A top chassis is configured to cover an edge portion of a top surface and side surfaces of the display panel. The top chassis has at least one opening in an area corresponding to the at least one flexible printed circuit board.

The display device may include a thin film cover disposed on an outside surface of the top chassis and configured to seal the opening.

The thin film cover may include a poly tetra fluoroethylene-based film, a flame-retarding poly vinyl chloride film, a flame-retarding poly ester film, a flame-retarding poly ether film, a poly ethylene imide film, a silicon film, a silicon rubber film, a fluorine resin film, an insulating film, a teflon film, a poly vinyl chloride-based protective film, a polyethylene-based film, or a polyolefin-based film.

The top chassis may have an opening having the same width as the flexible printed circuit board.

The top chassis may have an opening having a larger width than the width of the flexible printed circuit board.

The top chassis may include a bezel unit configured to cover the edge portion of the top surface of the display panel. A side wall portion may be bent downwards from the bezel unit and may be configured to cover the side surfaces of the display panel. The opening may be in the side wall portion of the top chassis.

According to an embodiment of the present invention, a display device includes a display panel and a bottom chassis in which the display panel is disposed. A driving circuit substrate is disposed on an outside surface of the bottom chassis. At least one flexible printed circuit board connects the display panel to the driving circuit substrate. A top chassis is configured to cover an edge portion of a top surface and side surfaces of the display panel. The top chassis has at least one protrusion disposed in an area corresponding to the at least one flexible printed circuit board.

The top chassis may be bent outwards to form the protrusion.

The top chassis may have an opening in an area facing the protrusion.

The opening may be substantially the same size as the protrusion.

The opening may have a larger size than the protrusion.

The top chassis may include a bezel unit configured to cover the edge portion of the top surface of the display panel. A side wall portion may be bent downwards from the bezel unit and may be configured to cover the side surfaces of the display panel. The side wall portion may have a first side wall portion in contact with the flexible printed circuit board and a second side wall portion facing the first side wall portion. The protrusion may be disposed in the first sidewall portion and the second side wall portion may have an opening in an area corresponding to the protrusion.

According to an embodiment of the present invention, a multi-display device includes a first display device and a second display device adjacently disposed to each other. The first display device and the second display device each include a display panel and a bottom chassis in which the display panel is disposed. A driving circuit substrate is disposed on an outside surface of the bottom chassis. At least one flexible printed circuit board connects the display panel to the driving circuit substrate. A top chassis is configured to cover an edge portion of a top surface and side surfaces of the display panel. The top chassis has at least one protrusion disposed in an area corresponding to the at least one flexible printed circuit board.

The top chassis may have an opening in an area facing the protrusion.

The protrusion of the first display device and the opening of the second display device may be adjacently disposed.

The protrusion of the first display device may be disposed in the upending of the second display device.

According to embodiments of the present invention, a part of the top chassis in contact with the flexible printed circuit board may be omitted, thereby preventing a flexible printed circuit board from being pressed and damaged by a top chassis.

In a multi-display device using the display device according to an embodiment of the present invention, the protrusion formed on a top chassis of one display device may be disposed in an opening in a top chassis of another display device, thereby reducing or preventing a width increase of the non-display area.

BRIEF DESCRIPTION OF THE DRAWINGS

A more complete appreciation of the present invention will become more apparent by describing in detail exemplary embodiments thereof with reference to the accompanying drawings, wherein.

DETAILED DESCRIPTION

Hereinafter, exemplary embodiments of the present invention will be described in more detail with reference to the accompanying drawings. The present invention may, however, be embodied in many different forms and should not be construed as being limited to the embodiments disclosed herein.

Throughout the specification, when an element is referred to as being "connected" to another element, the element may be "directly connected" to the other element, or "electrically connected" to the other element with one or more intervening elements interposed therebetween.

Like reference numerals may refer to like elements throughout the specification and drawings.

Hereinafter, a liquid crystal display (LCD) may be included in the display device according to an exemplary embodiment of the present invention. However, exemplary embodiments of the present invention can be applied to an organic light emitting diode (OLED) display or a plasma display panel (PDP).

Figure 1:
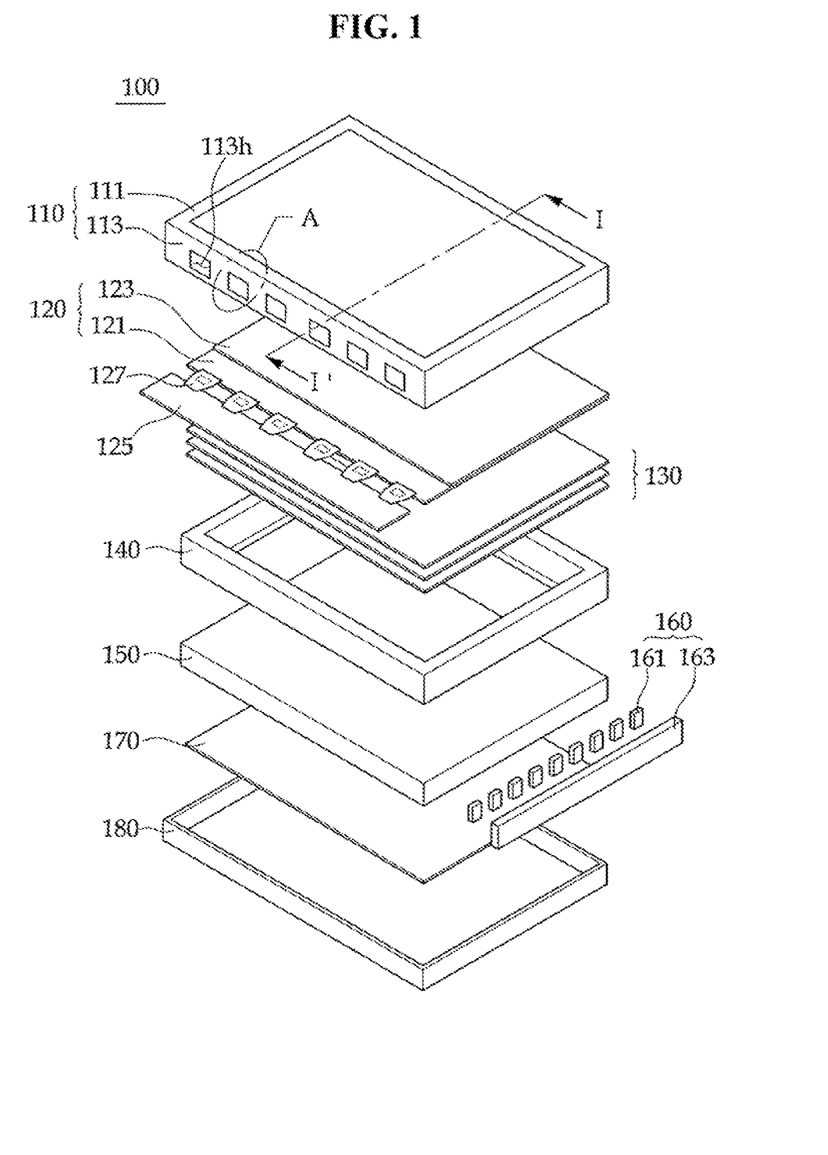
FIG. 1 is a schematic exploded perspective view illustrating a display device according to an exemplary embodiment of the present invention.
Figure 2:
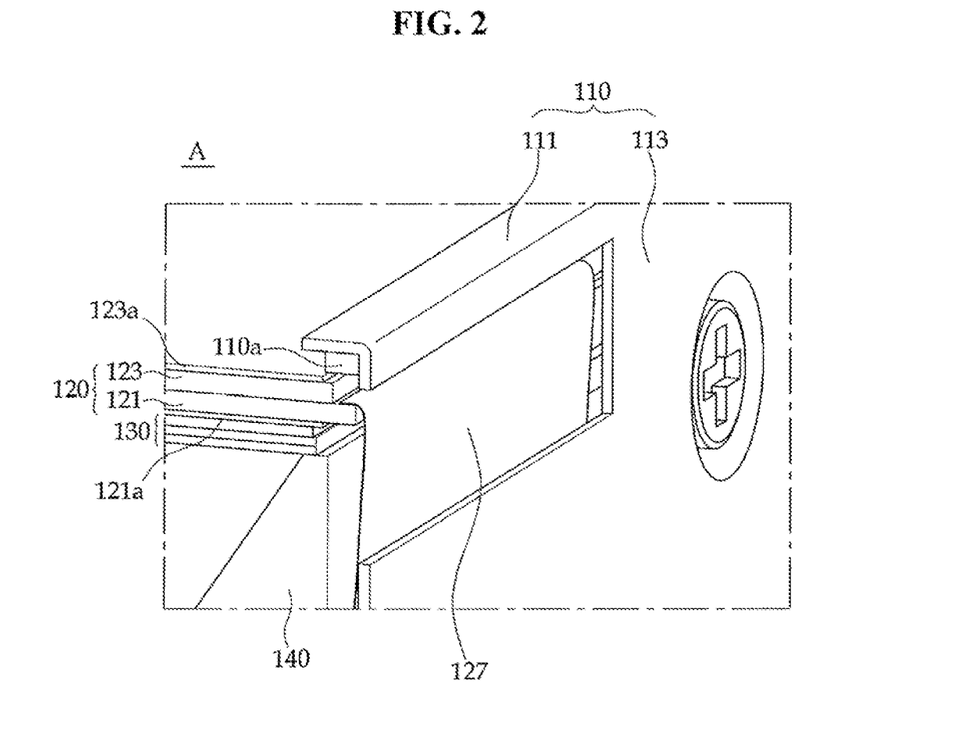
FIG. 2 is a partial perspective view enlarging an 'A' part of FIG. 1.
Figure 3:
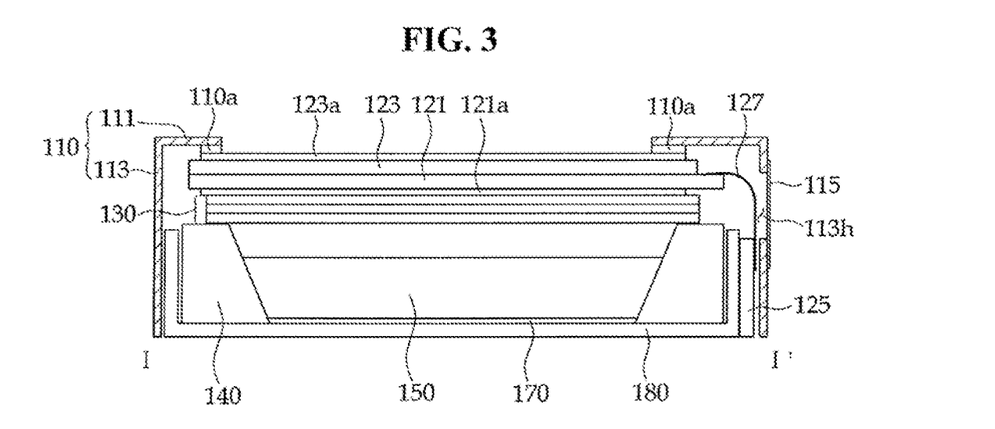
FIG. 3 is a cross-sectional view taken along a line I-I' of FIG. 1.

FIG. 1 is a schematic exploded perspective view illustrating a display device according to an exemplary embodiment of the present invention, FIG. 2 is a partial perspective view enlarging an 'A' part of FIG. 1, and FIG. 3 is a cross-sectional view taken along a line I-I' of FIG. 1;

Referring to FIGS. 1 to 3, a display device 100 according to an exemplary embodiment of the present invention may include a top chassis 110, a display panel 120, an optical sheet 130, a mold frame 140, a light guide plate 150, a light source unit 160, a reflective sheet 170, and a bottom chassis 180.

A backlight unit may include the optical sheet 130, the mold frame 140, the light guide plate 150, the light source unit 160, the reflective sheet 170, and the bottom chassis 180.

The top chassis 110 may have an opening for exposing an active area of the display panel 120 and may cover an edge portion of a top surface and side surfaces of the display panel 120.

The top chassis 110 may include a bezel unit 111 configured to cover the edge portion of the top surface of the display panel 120 and a side wall portion 113 bent downwards from the bezel unit 111 and configured to cover the side surfaces of the display panel 120.

The bezel unit 111 may be configured to fix the edge portion of the top surface of the display panel 120 and may prevent the display panel 120 from being separated from the backlight unit. The side wall portion 113 may be fixed to the mold frame 140 and the bottom chassis 180 by hooks and/or screws.

The display device 100 according to an exemplary embodiment of the present invention may include at least one opening 113h in the top chassis 110. The opening 113h may be in an area corresponding to a flexible printed circuit board 127.

In FIGS. 1 to 3, the opening 113h is depicted as being formed on the side wall portion 113 of the top chassis 110. However, exemplary embodiments of the present invention are not limited thereto, and the opening 113h may be in the bezel unit 111 or in both of the bezel unit 111 and the side wall portion 113.

The top chassis 110 may include the opening 113h having substantially the same width as the flexible printed circuit board 127 or may include the opening 113h having a larger width compared to the width of the flexible printed circuit board 127.

When the opening 113h is included in the top chassis 110, the top chassis 110 need not be directly in contact with the flexible printed circuit board 127. When the top chassis 110 is in contact with the display panel 120, damage to the flexible printed circuit board 127, which may occur when the top chassis 110 is, for example, pressed, may be prevented.

In FIG. 1, it is illustrated that the opening 113h may be in only one side wall portion 113 among four side wall portions 113. However, exemplary embodiments of the present invention are not limited thereto, and thus the opening 113h may be in at least one side wall portion 113 among four side wall portions 113.

The top chassis 110 may include a rigid metal material, such as stainless steel, or a heat dissipating material, such as aluminum or an aluminum alloy.

Referring to FIG. 2, the display device 100 may include a buffer member 110a disposed between the top chassis 110 and the display panel 120. The buffer member 110a may be disposed between the bezel unit 111 of the top chassis 110 and the display panel 120.

The buffer member 110a may be fixed to an inner surface of the top chassis 110 using an adhesive member, such as a double-sided tape (not illustrated). The buffer member 110a may be a quadrilateral strap extended along the bezel unit 111 or may be two or more separate straps. When the buffer member 110a is two or more separate straps, the respective buffer member 110a may be disposed along facing sides of the bezel unit 11.

The buffer member 110a may include a material having elastic properties, such as rubber. The buffer member 110a may reduce or prevent damage to the display panel 120 caused by the top chassis 110 formed of a metal material releasing electrostatic charges stored in the display panel 120, and may reduce or prevent light leakage between the top chassis 110 and the display panel 120.

Referring to FIG. 3, the display device 100 according to an exemplary embodiment of the present invention may include a thin film cover 115 attached to an outside surface of the top chassis 110 and configured to seal the opening 113h.

The thin film cover 115 may include a sealing member disposed on an edge portion of the film cover 115. The sealing member may be attached to the outside surface of the top chassis 110 and may seal the opening 113h.

The thin film cover 115 may be a poly tetra fluoroethylene (PTFE)-based film, a flame-retarding poly vinyl chloride (PVC) film, a flame-retarding poly ester film, a flame-retarding poly ether film, a poly ethylene imide (PEI) film, a silicon film, a silicon rubber film, a fluorine resin film, an insulating film, a teflon film, a poly vinyl chloride (PVC) protective film, a polyethylene (PE)-based film, or a polyolefin (PO)-based film.

The thin film cover 115 may be dust-resistant and moisture-resistant and may prevent infiltration of moisture and undesired materials into the display device 100. The thin film cover 115 may have a black-based color and may prevent light leakage.

Referring to FIGS. 1 to 3, the display panel 120 may be a quadrilateral panel displaying images using light. Many different display panels, such as a LCD and an electrophoretic display, may be used as the display panel 120. The LCD is used as the display panel 120 according to an exemplary embodiment of present invention.

The display panel 120 may include a first substrate 121, a second substrate 123 disposed to face the first substrate 121, and a liquid crystal layer (not illustrated) disposed between the first substrate 121 and the second substrate 123.

The first substrate 121 may include a plurality of pixel electrodes arranged in a matrix form, a thin film transistor configured to apply a driving voltage to the respective pixel electrodes, and various signal lines configured to drive the pixel electrodes and the thin film transistor.

The second substrate 123 may be disposed to face the first substrate 121 and may include a common electrode including a transparent conductive material and a color filter. The color filter may include red, green, or blue color filters.

The liquid crystal layer (not illustrated) may be disposed between the first substrate 121 and the second substrate 123 and may be rearranged in accordance with an electric field formed between the pixel electrode and the common electrode. The rearranged liquid crystal layer may adjust transmittance of light emitted from the backlight unit and the adjusted light may pass through the color filter, thereby displaying images.

A lower polarizing plate 121a may be disposed on a rear surface of the first substrate 121 and an upper polarizing plate 123a may be disposed on a top surface of the second substrate 123. The upper polarizing plate 123a and the lower polarizing plate 121a may have areas corresponding to the display panel 120. The upper polarizing plate 123a may only allow light having a predetermined polarization direction among light incident from the outside of the display device to pass through and may absorb or block the other light. The lower polarizing plate 121a may only allow light having a predetermined polarization direction among light emitted from the backlight unit to pass through and may absorb or block the other light.

A driving circuit substrate 125 may be disposed on at least one side of the display panel 120. The driving circuit substrate 125 may apply driving signals to the various signal lines disposed on the first substrate 121. The driving circuit substrate 125 may include a gate driving circuit substrate configured to apply scan signals and a data driving circuit substrate configured to apply data signals. In FIG. 1, it is illustrated that the driving circuit substrate 125 is disposed on only one side of the display panel 120; however, exemplary embodiments of the present invention are not limited thereto.

The display panel 120 and the driving circuit substrate 125 may be electrically connected to each other by at least one flexible printed circuit board 127. A first end portion of the flexible printed circuit board 127 may overlap a part of the first substrate 121 and may be electrically connected to the first substrate 121. A second end portion of the flexible printed circuit board 127 may overlap a part of the driving circuit substrate 125 and may be electrically connected to the driving circuit substrate 125.

The flexible printed circuit board 127 may be, for example, a chip on film (COF) or a tape carrier package (TCP). Hereinafter, the COF may be used as the flexible printed circuit board 127. In FIG. 1, it is illustrated that seven flexible printed circuit boards 127 are disposed. However, exemplary embodiments of the present invention are not limited thereto, and the number of the flexible printed circuit boards 127 may be adjustable depending, for example, on the size and the driving methods of the display panel 120.

A driving chip (not illustrated) may be disposed on the flexible printed circuit board 127. The driving chip may generate various driving signals driving the display panel 120. The driving chip may include a timing controller and a data driving circuit in a single chip. The driving chip may be a driver integrated circuit (IC) or a source integrated circuit (IC).

A plurality of flexible printed circuit boards 127 may be disposed on one side of the display panel 120 and may be bent along the mold frame 140 or the side surface of the bottom chassis 180. The driving circuit substrate 125 may be disposed on the side surface or an edge portion of the rear surface of the bottom chassis 180.

The optical sheet 130 may be disposed on the light guide plate 150 and may be configured to diffuse and/or collect light transmitted from the light wide plate 150. The optical sheet 130 may include a diffusion sheet, a prism sheet, and a protective sheet. In FIG. 1, it is illustrated that three optical sheets 130 are provided; however, two, four, or more optical sheets may be provided.

The diffusion sheet may be configured to disperse light emitted from the light guide plate 150 and may reduce or prevent light from being partly concentrated.

The prism sheet may include prisms, which may have a triangular cross-section and may be aligned in a predetermined arrangement, on one surface thereof. The prism sheet may be disposed on the diffusion sheet and may collect light diffused from the diffusion sheet in a direction perpendicular to the display panel 120.

The protective sheet may be disposed on the prism sheet. The protective sheet may protect a surface of the prism sheet, may diffuse light, and may achieve a uniform light distribution.

The mold frame 140 may be a quadrilateral-loop and may accommodate and support the display panel 120, the optical sheet 130, and the light guide plate 150. The mold frame 140 may be a single unit as illustrated in FIG. 1. However, a plurality of units may be assembled to form the mold frame 140, as desired.

The light guide plate 150 may uniformly guide light emitted from the light source unit 160 to the display panel 120. The light guide plate 150 may be disposed adjacently to the light source unit 160 and may be accommodated in the bottom chassis 180. The light guide plate 150 may be a quadrilateral plate. However, exemplary embodiments of the present invention are not limited thereto, and when an LED chip is used as a light source, the light guide plate 150 may include predetermined grooves, protrusions, or the like depending on the position of the light source.

The light guide plate 150 may be a plate, but it may also be a sheet or a film in a relatively thin display device. The light guide plate 150 may be the plate or the film and may be configured to guide light.

The light guide plate 150 may include a light-transmissive material including, for example, acrylic resins, such as polymethylmethacrylate (PMMA), car polycarbonate (PC).

The reflective sheet 170 may be disposed between the light guide plate 150 and the bottom chassis 180. The reflective sheet 170 may reflect light downwards from the light guide plate 150 to the display panel 120, and light transmission efficiency may be increased.

The reflective sheet 170 may include, for example, polyethylene terephthalate (PET). A surface of the reflective sheet may be coated with a diffusion layer containing, for example, titanium dioxide. The reflective sheet 170 may include a material including metal, such as silver (Ag).

The light source unit 160 may include a light source 161 and a circuit substrate 163 on which the light source 161 is disposed.

The light source 161 may be disposed at an edge portion or on a light incident surface of the light guide plate 150. The light source 161 may emit light toward the edge portion or the light incident surface of the light guide plate 150. The light source 161 may include at least one LED chip (not illustrated) and a package (not illustrated) accommodating the LED chip. For example, the LED chip may be a gallium nitride (GaN)-based LED chip that emits blue light.

The number of the light source 161 may vary in consideration of the size and/or luminance uniformity of the display panel 120. The circuit substrate 163 may be a printed circuit board (PCB) or a metal PCB.

Although not illustrated in FIG. 1, a wavelength converting unit may be disposed between the light guide plate 150 and the light source unit 160. The wavelength converting unit may include a substance that can change a wavelength of light. For example, the wavelength converting unit may change a wavelength of blue light emitted from a blue LED light source, and the blue light may be converted to white light.

Although not illustrated in FIG. 1, a heat dissipating member may be disposed between the light source unit 160 and the bottom chassis 180. The heat dissipating member may dissipate heat generated from the light source unit 160 to the outside. When the light source unit 160 is disposed on a side surface of the bottom chassis 180 in a bar or line shape, a metal frame having the bar or line shape may be disposed as the heat dissipating member. The heat dissipating member may have various shapes depending on the shape of the light source unit 160.

The bottom chassis 180 may include a rigid metal material, such as stainless steel, or a heat dissipating material, such as aluminum or aluminum alloys. The bottom chassis 180 may be configured to maintain a framework of the display device and may protect the components accommodated therein.

Figure 4:
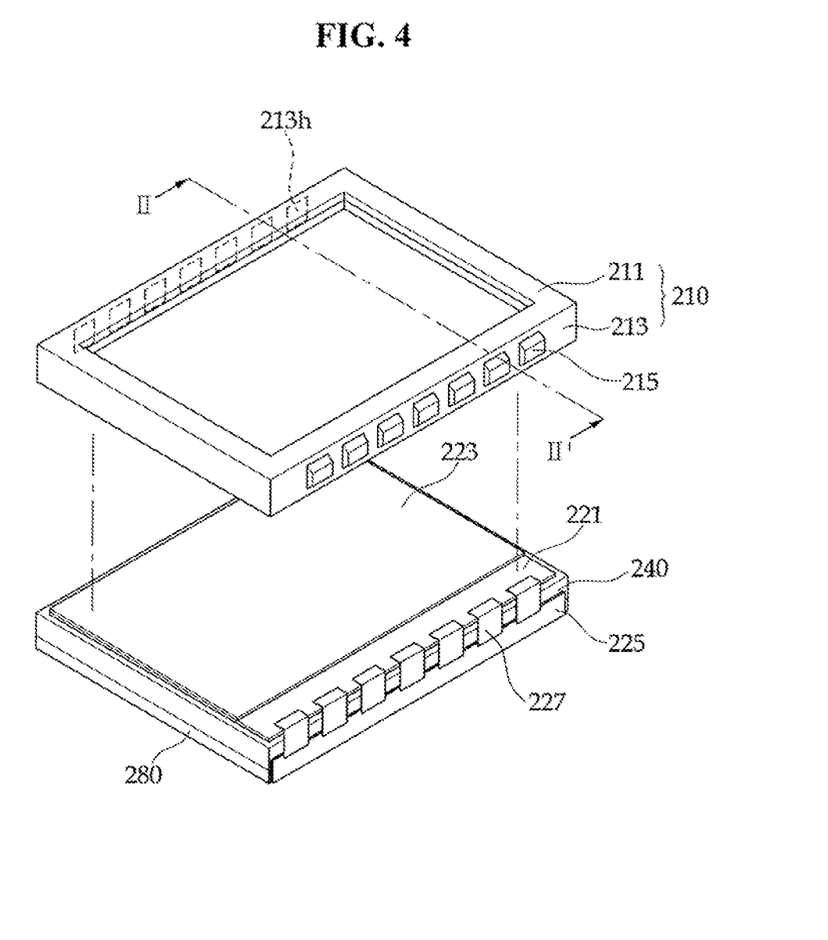
FIG. 4 is an exploded perspective view illustrating a display device according to an exemplary embodiment of the present invention.
Figure 5:
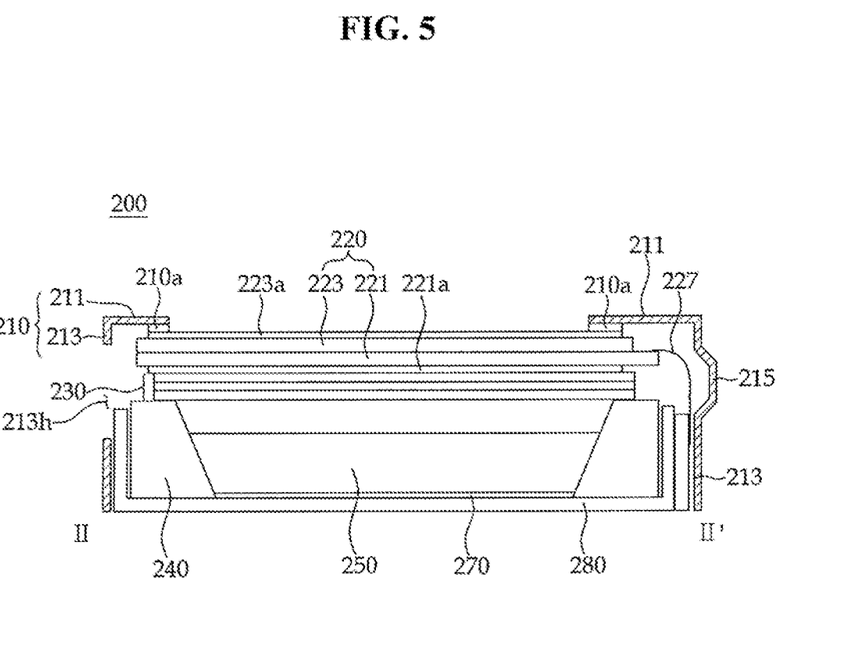
FIG. 5 is a cross-sectional view taken along a line II-II' of FIG. 4.

FIG. 4 is an exploded perspective view illustrating a display device according to an exemplary embodiment of the present invention and FIG. 5 is a cross-sectional view taken along a line II-II' of FIG. 4.

Referring to FIGS. 4 and 5, a display device 200 according to an exemplary embodiment of the present invention includes a top chassis 210, a display panel 220, an optical sheet 230, a mold frame 240, a light guide plate 250, a light source unit 260, a reflective sheet 270, and a bottom chassis 280. The display device 200 may further include a first substrate 221, second substrate 223, buffer member 210a, driving circuit substrate 225, lower polarizing plate 221a and upper polarizing plate 223a. Repeated descriptions illustrated in an exemplary embodiment of the present invention above might not be provided.

Referring to FIGS. 4 and 5, the top chassis 210 may include the opening 213h exposing the active area of the display panel 220. The top chassis 210 may cover an edge portion of a top surface and side surfaces of the display panel 220.

The top chassis 210 may include a bezel unit 211 configured to cover the edge portion of the top surface of the display panel 220 and a side wall portion 213 bent downwards from the bezel unit 211 and configured to cover the side surfaces of the display panel 220.

The display device 200 according to an exemplary embodiment of the present invention may have at least one protrusion 215 disposed on the top chassis 210. The protrusion 215 may include a protruding area of the top chassis 210 bent outwards. The protrusion 215 may be in an area corresponding to a flexible printed circuit board 227.

In FIGS. 1 to 3, it is illustrated that the protrusion 215 is disposed on the side wall portion 213 of the top chassis 210. However, exemplary embodiments of the present invention are not limited thereto, and the protrusion 215 may be disposed on the bezel unit 211 or may be disposed over both of the bezel unit 211 and the side wall portion 213.

The top chassis 210 may include the protrusion 215 having substantially the same width as the flexible printed circuit board 227 or may include the protrusion 215 having a larger width compared to the width of the flexible printed circuit board 227.

When the protrusion 215 is disposed on the top chassis 210, the top chassis 210 need not be directly in contact with the flexible printed circuit board 227. When the top chassis 213 is in contact with the display panel 220, damage to the flexible printed circuit board 227, which may occur when the top chassis 210 is, for example, pressed, can be reduced or prevented.

In FIG. 4, it is illustrated that the protrusion 215 is disposed on only one side wall portion 213 among four side wall portions 213. However, exemplary embodiments of the present invention are not limited thereto, and the protrusion 215 may be disposed on at least one side wall portion 213 among four side wall portions 213.

Hereinafter, a first side wall portion may refer to the side wall portion 213 on which the protrusion 215 is disposed and a second side wall portion may refer to the side wall portion 213 which faces the first side wall portion.

The top chassis 210 according to an exemplary embodiment of the present invention may include the opening 213h on the second side wall portion facing the first side wall portion on which the protrusion 215 is disposed. The opening 213h may be disposed in an area corresponding to the protrusion 215.

The top chassis 210 may have the opening 213h having substantially the same size as the protrusion 215 or may have the opening 213h having a larger size compared to the protrusion 215.

When the multi-display device includes the display device 200 according to an exemplary embodiment of the present invention, the opening 213h may have substantially the same size as or a larger size than the protrusion 215, such that a protrusion 215 of one display device 200 may be inserted into the opening 213h of another display device 200.

Figure 6A:
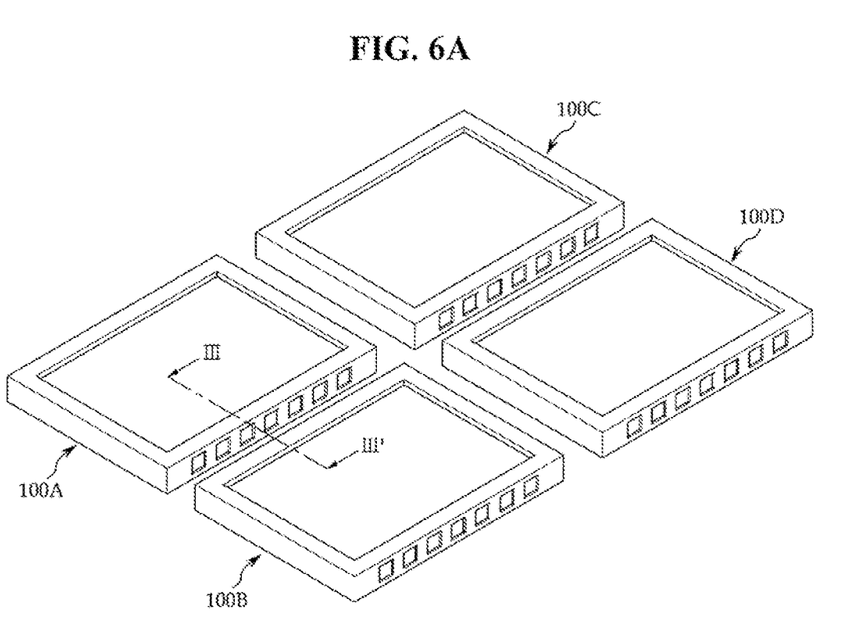
FIG. 6A is a schematic perspective view illustrating a multi-display device using the display device according to an embodiment of the present invention.
Figure 6B:
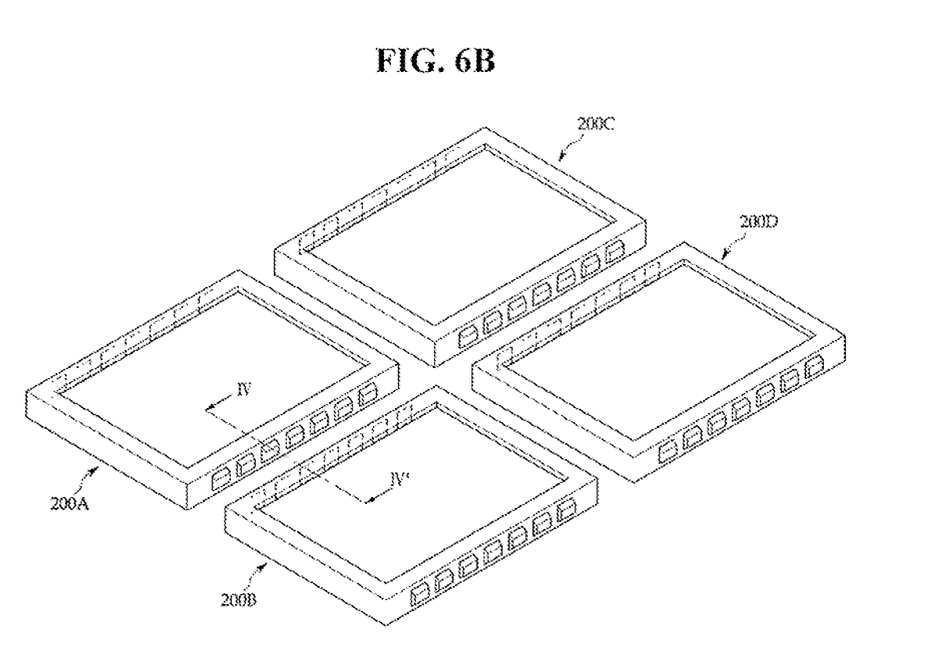
FIG. 6B is a schematic perspective view illustrating a multi-display device using the display device according to another embodiment of the present invention.

FIG. 6A is a schematic perspective view illustrating a multi-display device using the display device according to an exemplary embodiment of the present invention and FIG. 6B is a schematic perspective view illustrating a multi-display device using the display device according to an exemplary embodiment of the present invention.

FIG. 6A illustrates a plurality of display devices 100A, 100B, 100C, and 100D adjacently disposed to form the multi-display device. FIG. 6B illustrates a plurality of display devices 200A, 200B, 200C, and 200D adjacently disposed to form the multi-display device.

In FIGS. 6A and 6B, four display devices are disposed in a 2×2 matrix form to form the multi-display device, but exemplary embodiments of the present invention are not limited thereto and may have various arrangements.

The multi-display device may appear as one screen by minimizing non-display areas between display devices adjacently disposed to each other. When the top chassis and the display panel are disposed in contact with each other in order to minimize the non-display area, the flexible printed circuit board driving the display panel may be damaged by the top chassis.

When the display devices (e.g., display devices 100 or 200) according to an exemplary embodiment of the present invention are used in the multi-display device, the non-display areas may be reduced and the flexible printed circuit board (e.g., flexible printed circuit boards 127 or 227) need not be damaged by the top chassis (e.g., top chassis 110 or 210).

Figure 7A:
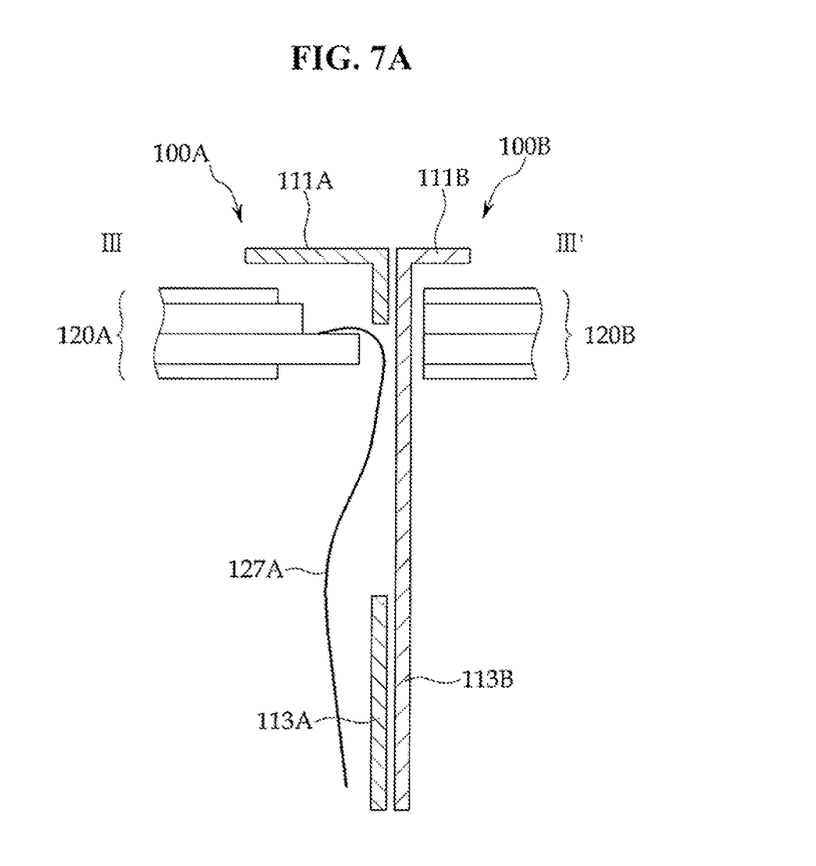
FIG. 7A is a cross-sectional view taken along a line III-III' of FIG. 6A.
Figure 7B:
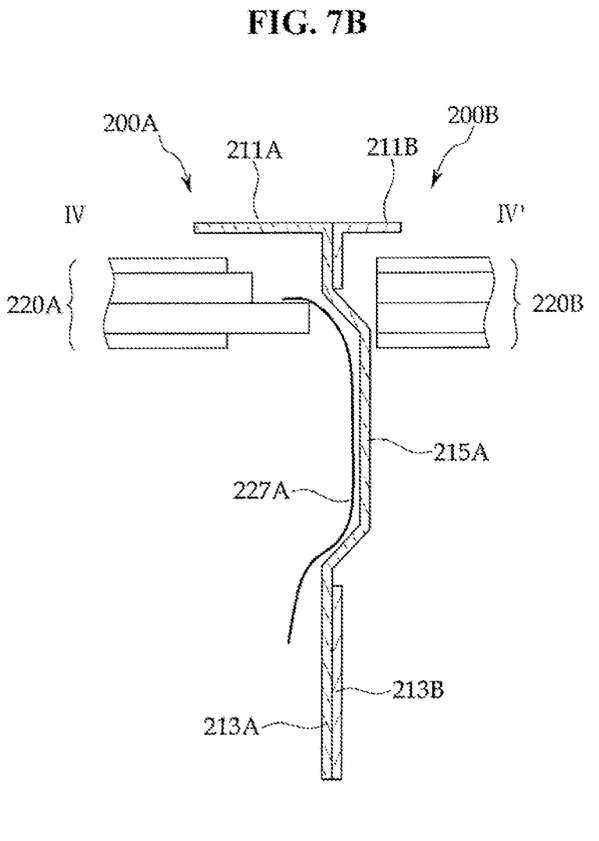
FIGS. 7B and 7C are cross-sectional views taken along a line IV-IV' of FIG. 6B.
Figure 7C:
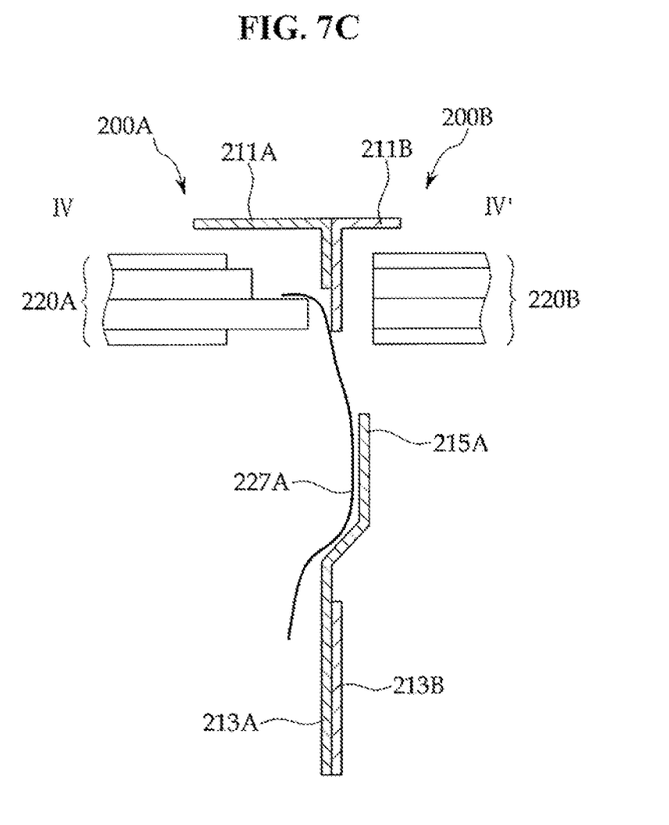

FIG. 7A is a cross-sectional view taken along a line III-III' of FIG. 6A and FIGS. 7B and 7C are cross-sectional views taken along a line IV-IV' of FIG. 6B.

Referring to FIG. 7A, two display devices 100A and 100B according to an exemplary embodiment of the present invention may be adjacently disposed. The two display devices may be respectively referred to as a first display device 100A and a second display device 100B.

A part of a side wall portion 113A of the first display device 100A, which may be in contact with a flexible printed circuit board 127A may be omitted, thereby preventing the flexible printed circuit board 127A from being pressed and damaged by the top chassis (e.g., top chassis 110).

The flexible printed circuit board 127A of the first display device 100A may be covered by a side wall portion 113B of the second display device 100B, thereby preventing the flexible printed circuit board 127A of the first display device 100A from being visible from the outside.

Referring to FIG. 7B, two display devices 200A and 200B according to an exemplary embodiment of the present invention may be adjacently disposed. The two display devices may be respectively referred to as a first display device 200A and a second display device 200B.

The first display device 200A may have a protrusion 215A disposed on a side wall portion 213A that may be in contact with the flexible printed circuit board 227A, thereby preventing the flexible printed circuit board 227A from being pressed and damaged by the top chassis (e.g., top chassis 110).

The protrusion 215A of the first display device 200A may be disposed in an opening formed on a side wall portion 213B of the top chassis of the second display device 200B. The flexible printed circuit board 227A of the first display device 200A need not be visible from the outside. An increase in a width of the non-display area because of a width of the protrusion 215A may be prevented.

FIG. 7C is a modified form of an embodiment of FIG. 7B. In FIG. 7C, the opening is formed on the protrusion 215A.

While the present invention has been shown and described with reference to the exemplary embodiments thereof, it will be apparent to those of ordinary skill in the art that various changes in form and detail may be made thereto without departing from the spirit and scope of the invention as defined by the claims.

What is claimed is:

1. A multi-display device comprising:
a first display device and a second display device adjacently disposed to each other,
wherein the first display device and the second display device each comprise:
a display panel;
a bottom chassis in which the display panel is disposed;
a driving circuit substrate disposed on an outside surface of the bottom chassis;
a plurality of flexible printed circuit boards connecting the display panel to the driving circuit substrate; and
a top chassis configured to cover an edge portion of a top surface and side surfaces of the display panel,
wherein the top chassis comprises:
a bezel unit configured to cover the edge portion of the top surface of the display panel; and
a side wall portion bent downwards from the bezel unit and configured to cover the side surfaces of the display panel,
wherein the top chassis has at least one protrusion bent from the side wall portion outward from the display panel, wherein a width of the at least one protrusion is at least as wide as a width of at least one flexible printed circuit board of the plurality of flexible printed circuit boards, and
wherein the side wall portion and the protrusion overlap with a surface of the at least one flexible printed circuit board.

2. The multi-display device of claim 1, wherein the top chassis has an opening in an area facing the protrusion.

3. The multi-display device of claim 2, wherein the protrusion of the first display device and the opening of the second display device are adjacently disposed.

4. The display device of claim 3, wherein the protrusion of the first display device is disposed in the opening of the second display device.

5. A multi-display device, comprising:
a first display device and a second display device adjacently disposed to each other,
wherein each of the first and second display devices comprises:
a display panel;
a top chassis comprising a side surface, wherein the top chassis is configured to cover side surfaces of the display panel;
a plurality of flexible printed circuit boards configured to connect the display panel to a driving circuit substrate, wherein the driving circuit substrate is adjacently disposed to the side surface of the top chassis,
wherein the first display device comprises a plurality of openings, wherein each of the plurality of openings is in a position corresponding to one of the flexible printed circuit boards,
wherein the second display device comprises a plurality of protrusions, wherein the protrusions are bent from the side surface outward from the display panel and a width of the protrusions is at least as wide as a width of the each of the plurality of flexible printed circuit boards, and
wherein each of the protrusions of the second display device is disposed in one of the plurality of openings of the first display device and the side surface and each of the protrusions overlaps with a surface of each of the flexible printed circuit boards.

6. The multi-display device of claim 5, wherein the display panels of the first and second display devices further comprise a first substrate and a second substrate.

7. The multi-display device of claim 5, wherein the protrusion of the second display device further comprises a second opening.

8. The multi-display device of claim 5, wherein the display panels of the first and second display devices further comprise a buffer member disposed between the top chassis and the display panel.

9. The multi-display device of claim 5, further comprising a thin film cover disposed on an outside surface of the top chassis of the first and second display devices.

10. A multi-display device comprising:
a first display device and a second display device adjacently disposed to each other,
wherein the first display device and the second display device each comprise:
a display panel;
a top chassis comprising a side surface, wherein the top chassis is configured to cover side surfaces of the display panel;
a plurality of flexible printed circuit boards configured to connect the display panel to a driving circuit substrate, wherein the driving circuit substrate is adjacently disposed to the side surface of the top chassis,
wherein the first display device comprises a plurality of openings, wherein at least one flexible circuit board is in a position corresponding to one of the openings,
wherein the at least one flexible circuit board is directly covered by a sidewall portion of the second display device and no structures are disposed between the at least one flexible circuit board and the sidewall portion of the second display device.

11. The multi-display device of claim 10, wherein a width of the plurality of openings is at least as wide as a width of at least one flexible printed circuit board.

* * * * *